(12) United States Patent
Vissenberg et al.

(10) Patent No.: US 7,980,747 B2
(45) Date of Patent: Jul. 19, 2011

(54) LIGHT EMITTING DIODE LIGHTING DEVICE

(75) Inventors: Michel C. J. M. Vissenberg, Eindhoven (NL); Willem L. Ijzerman, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 282 days.

(21) Appl. No.: 12/439,791

(22) PCT Filed: Oct. 12, 2007

(86) PCT No.: PCT/IB2007/054170
§ 371 (c)(1),
(2), (4) Date: Mar. 3, 2009

(87) PCT Pub. No.: WO2008/047286
PCT Pub. Date: Apr. 24, 2008

(65) Prior Publication Data
US 2010/0053955 A1    Mar. 4, 2010

(30) Foreign Application Priority Data

Oct. 16, 2006    (EP) .................................... 06122321
Oct. 30, 2006    (EP) .................................... 06123127

(51) Int. Cl.
*F21V 7/04* (2006.01)

(52) U.S. Cl. ..................... 362/612; 362/235; 362/630

(58) Field of Classification Search .................. 362/235, 362/612, 630, 631, 613, 615–628, 26, 27, 362/800
See application file for complete search history.

(56) References Cited

U.S. PATENT DOCUMENTS

| | | | |
|---|---|---|---|
| 6,871,975 B2 * | 3/2005 | Chuang | 362/27 |
| 7,083,317 B2 | 8/2006 | Higashiyama | |
| 7,168,842 B2 * | 1/2007 | Chou et al. | 362/631 |
| 7,192,176 B2 * | 3/2007 | Lo et al. | 362/612 |
| 7,374,327 B2 * | 5/2008 | Schexnaider | 362/613 |
| 7,484,877 B2 * | 2/2009 | Masamoto et al. | 362/631 |

FOREIGN PATENT DOCUMENTS

| | | |
|---|---|---|
| JP | 10062786 A | 3/1998 |
| JP | 2003081967 A | 3/2003 |
| JP | 2004241282 A | 8/2004 |
| KR | 100540055 B1 | 12/2005 |
| WO | 2006137660 A2 | 12/2006 |

* cited by examiner

*Primary Examiner* — Bao Q Truong
(74) *Attorney, Agent, or Firm* — Mark L. Beloborodov

(57) ABSTRACT

The present invention relates to a light emitting diode (LED) lighting device (10). The device comprises a light guide plate (12), a plurality of LEDs (14) for emitting light into the light guide plate, a plurality of out-coupling structures (20) adapted to extract light from the light guide plate, and first and second electrodes (22, 24) connected to the LEDs. The first electrode is arranged at one side (28) of the light guide plate and the second electrode is arranged at the other side (30) of the light guide plate. Such a lighting device may have a reduced thickness.

9 Claims, 2 Drawing Sheets

LIGHT EMITTING DIODE LIGHTING DEVICE

This application is a national stage application under 35 U.S.C. §371 of International Application No. PCT/IB2007/054170 filed on Oct. 12, 2007, which claims priority to European Application No. 06122321.0, filed on Oct. 16, 2006 and European Application No. 06123127.0, filed on Oct. 30, 2006, both incorporated herein by reference.

FIELD OF THE INVENTION

The present invention relates to a lighting device comprising a plurality of light emitting diodes.

BACKGROUND OF THE INVENTION

Lighting devices based on light emitting diodes (LEDs) are expected to replace traditional fluorescent lighting and spotlight fixtures, due to the LEDs superior properties when it comes to power consumption, endurance, size, etc.

Existing LED based lighting devices usually comprises a dedicated dual layer printed circuit board (PCB) or similar for connecting the LEDs. An example of such a LED based lighting device is disclosed for example in U.S. Pat. No. 7,083,317, wherein LEDs are mounted on a flexible wiring board. Further, light emitting surfaces of the LEDs are in contact with a light entrance end surface of a light guide plate for coupling light into the light guide plate.

However, the use of a dedicated PCB or wiring board may increase the thickness of the lighting device. Also, the dedicated PCB may imply no little cost of the lighting device.

SUMMARY OF THE INVENTION

It is an object of the present invention to overcome or at least alleviate these problems, and to provide an improved lighting device.

These and other objects that will be apparent from the following description are achieved by means of a light emitting diode (LED) lighting device, comprising a light guide plate, a plurality of LEDs for emitting light into the light guide plate, a plurality of out-coupling structures adapted to extract light from the light guide plate, and first and second electrodes connected to the LEDs, wherein the first electrode is arranged at one side of the light guide plate and the second electrode is arranged at the other side of the light guide plate.

The invention is based on the understanding that the light guide plate can be used to electrically isolate the two electrodes. The two electrodes may have different polarities. Any dedicated PCB or additional isolating layer for accommodating the electrodes becomes obsolete, whereby the lighting device of the invention can be have a reduced thickness and the cost for the lighting device can be cut. Also, the electrodes can be used as a heat spreader on both sides of the light guide plate, thereby removing the need for any dedicated heat sink and again reducing the cost of the lighting device.

Both the LEDs and the out-coupling structures are preferably arranged in the plane of the light guide plate. For example, the LEDs may be accommodated in holes arranged in the light guide plate.

The electrodes can be structured or unstructured. The structured electrode can be realized by a plate or foil with holes or by a wire grid, while the unstructured electrode can be realized by a simple conducting plate or foil.

In a preferred embodiment, the bottom electrode is unstructured, while the top electrode is structured with optically transparent areas (such as apertures or holes) at the positions where light is extracted from the light guide plate by means of the out-coupling structures. In such an embodiment, the electrodes can also be used as a shield for light that might leak from the LEDs in unwanted direction, increasing the efficiency of the lighting device and allowing it to comply with anti-glare requirements. The direction "top" here refers to the main light emitting direction of the lighting device.

Also preferably, the LEDs or series of LEDs are connected in parallel, whereby any failure of individual LEDs or series of LEDs will not significantly affect the overall operation of the lighting device. The parallel connection may for example be achieved by using LEDs with top-bottom contacts connecting to the top and bottom electrode, respectively. Generally, the choice of LED contacts (top and bottom, bottom only, top only) is related to the choice of structuring of the electrode(s). An additional advantage with the use of top-bottom contact LEDs connected to the electrodes is that it becomes possible to clamp the light guide plate between the electrodes. Thus, the light guide can be fixed to the electrodes simply by mechanical pressure, without optical contact, and no attachment means such as glue is necessary.

BRIEF DESCRIPTION OF THE DRAWINGS

This and other aspects of the present invention will now be described in more detail, with reference to the appended drawings showing currently preferred embodiments of the invention.

FIG. 2b is a top view of the bottom electrode of the device in FIG. 2a.

DETAILED DESCRIPTION

Figure 1A:
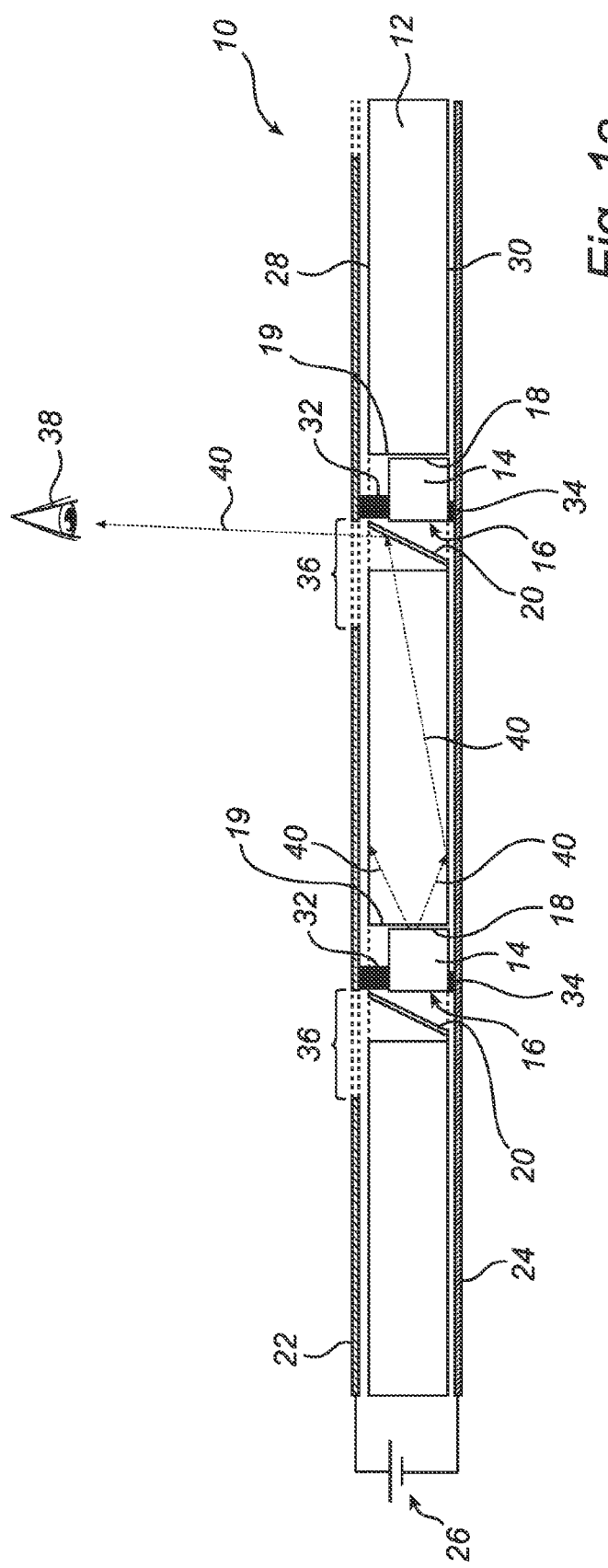
FIG. 1a is a cross-sectional side view of a lighting device according to an embodiment of the invention.

FIG. 1a is a cross-sectional side view of a lighting device 10 according to an embodiment of the invention. The lighting device 10 comprises a light guide plate 12. The light guide plate 12 is transparent and can be made of glass or plastics.

The lighting device 10 further comprises a plurality of light emitting diodes (LEDs) 14 arranged in the plane of the light guide plate 12 and adapted to emit light into the light guide plate 12. Namely, in FIG. 1, the LEDs are side-emitting LEDs 14 placed in through holes 16 in the light guide plate 12. The light-emitting surface of the LEDs 14 is designated 18. Alternatively, the LEDs could be top emitting LEDs tilted about 90 degrees. Each hole 16 has an in-coupling side facet 19, for coupling light from the LED 14 in the hole 16 into the light guide plate 12. All in-coupling side facets are preferably facing the same direction. The LEDs 14 are preferably low power LEDs, for reducing the power consumption of the lighting device 10 and to decrease the generation of heat during operation. Also, low power LEDs are usually smaller, which allows for a thinner lighting device 10.

Additionally, the lighting device 10 comprises a plurality of out-coupling structures 20 arranged in the plane of the light guide plate 12 and adapted to extract light from the light guide plate 12. Namely, in FIG. 1, the out-coupling structures are here reflective surfaces 20 provided in the light guide plate 12 at the opposite side of the holes 16 with respect to the in-coupling side facets 19. The reflective surfaces 20 are tilted about 45 degrees in relation to the plane of the light guide plate 12. The remaining side walls of each hole 16 between the in-coupling facet 19 and the opposite reflective surface 20 are adapted to reflect any incoming light, for instance by means of TIR. Also, the LEDs 14 and reflective surfaces 20 are preferably arranged in the plane of the light guide plate according to a staggered distribution, as illustrated in FIG. 1b.

Furthermore, returning to FIG. 1a, the lighting device 10 comprises a top electrode 22 and a bottom electrode 24 for connecting the LEDs 14 to a power source 26 in parallel. The electrodes 22, 24 may each be comprised of a conducting metal foil or plate. The top electrode 22 is arranged at the topside 28 of the light guide plate 12, and the bottom electrode 24 is arranged at the bottom side 30 of the light guide plate 12, whereby the light guide plate 12 acts as an electrical isolator between the two electrodes 22, 24. The top electrode 22 is connected to the LEDs 14 via top contacts 32 on each LED 14, while the bottom electrode 24 is connected to the LEDs 14 via bottom contacts 34 on each LED 14. This structure where the electrodes 22, 24 are held together by their fixation to the LEDs 14 makes it possible to clamp the light guide plate 12 between the electrodes 22, 24 and attach it without any dedicated attachment means such as glue or the like.

Figure 1B:
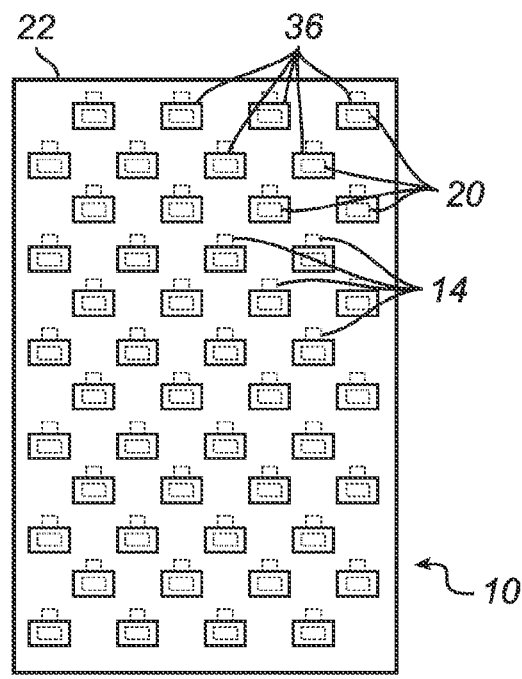
FIG. 1b is a top view of the device in FIG. 1a, FIG. 2a is a top view of a lighting device according to another embodiment of the invention.

As further illustrated in FIG. 1b, the top electrode 22 is structured, while the bottom electrode 24 is unstructured. Namely, the top electrode 22 comprises optically transparent areas in the form of discrete holes 36, which holes 36 are aligned with the underlying out-coupling structures 20. It should be noted that the holes 36 due to their position do not interfere with the feeding of the LEDs 14. In FIG. 1b, the underlying the LEDs 14 and out-coupling structures 20 are indicated with broken lines.

During operation of the lighting device 10, the LEDs 14 are fed by the power source 26 via the electrodes 22, 24, whereby light emitted by a LED 14 first is coupled into the light guide plate 12 and then coupled out of the same by means of the reflective surface 20 of another hole 16 in the direction of a viewer 38, as indicated by exemplary ray-traces 40, either directly or after being reflected by the side wall of at least one other hole. Since the holes 36 of the top electrode 22 are positioned directly above the out-coupling structures 20, the light exiting the light guide plate 12 can easily pass the top electrode 22 without obstruction. Further, the electrodes 22, 24 may stop any misdirected light from leaking out of the light guide plate 12, allowing the lighting device 10 to comply with anti-glare requirements. Further, the electrodes 22, 24 provides for removal of heat generated by the LEDs 14 during operation.

The thickness of the light guide plate 12 may be in the order of 1-1.5 mm, depending on the thickness of the LEDs 14. The inclusion of the electrodes 22, 24, one on each side of the plate, merely adds to the overall thickness of the lighting device 10. This should be compared to a case where the electrical connections for the LEDs are provided on a separate PCB, which PCB then is arranged parallel to the light guide plate. The PCB's thickness is comparable to that of the light guide plate, resulting in a lighting device with twice the thickness.

Figure 2A:
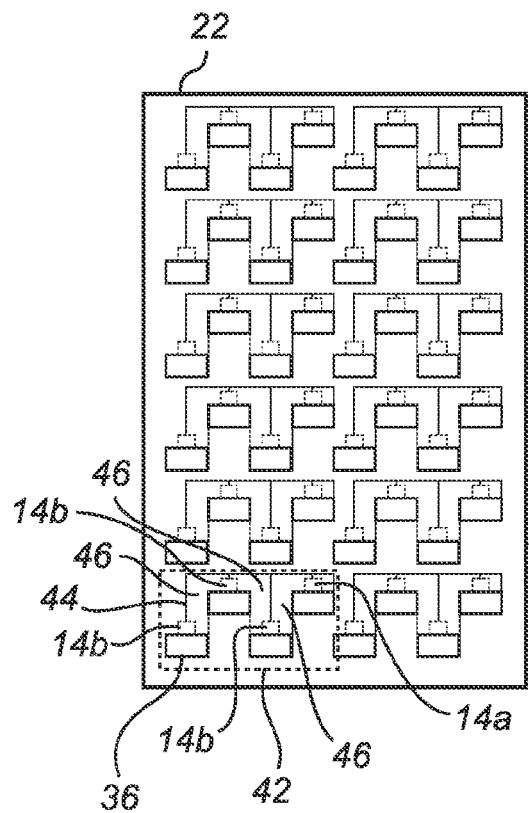
Figure 2B:
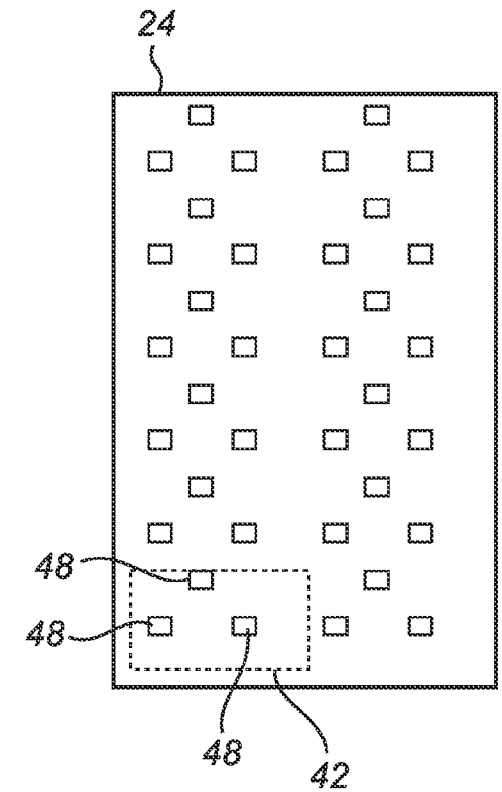

A lighting device 10 according to another embodiment of the invention will now be described in relation to FIGS. 2a-b. The device in FIGS. 2a-b has a different selection of LED contacts and structuring of the electrode compared to the device in FIGS. 1a-b. Namely, the device in FIGS. 2a-b comprises parallel clusters 42 of four LEDs in series. Each cluster or series 42 comprises one LED 14a with top and bottom contacts and three LEDs 14b with top contacts only. Isolating cuts 44 are provided in the top electrode 22 in order to connect the one top-bottom contact LED 14a in series with the top contact LEDs 14b and isolate them from other LEDs 14 of the device. Consequently, isolated electrically conductive "channels" 46 are provided between the LEDs of the series 42. Due to its bottom contact, the top-bottom LED 14a is still connected in parallel to other top-bottom LEDs of the lighting device. Also, the last LED 14b in the series connection is connected in parallel to the other groups of LEDs via the top electrode 22. Finally, to avoid short-circuiting, the bottom electrode 24 is provided with suitably sized isolating patches 48 aligned with the top contact LEDs 14b in order to isolate the top contact LEDs 14b, as can been seen in FIG. 2b. Alternatively, the bottom of the LEDs 14b may be isolating, then no patches are needed on the bottom electrode 24.

Applications for the LED based lighting device 10 according to the present invention includes indoor lighting such as office lighting or atmospheric or decorative lighting, outdoor lighting such as illumination of buildings, signs, etc.

The person skilled in the art realizes that the present invention by no means is limited to the preferred embodiments described above. On the contrary, many modifications and variations are possible within the scope of the appended claims. For example, many other combinations of LEDs with different contacts (top and bottom, bottom only, top only) and structuring of one or both of the electrodes are possible to achieve a desired coupling of the LEDs. Also, other arrangements and designs of the LEDs and out-coupling structures are envisaged. For instance, the side emitting LEDs may send out light in several different directions, and the out-coupling structures may be arranged to reflect light coming from several directions as well as direct light out of the light guide plate in several directions.

The invention claimed is:

1. A light emitting diode (LED) lighting device, comprising:
    a light guide plate having a top side and a bottom side,
    a plurality of LEDs for emitting light into the light guide plate,
    a plurality of out-coupling structures for extracting light from the light guide plate, and
    first and second electrodes connected to the LEDs, wherein the first electrode is arranged at the top side of the light guide plate and the second electrode is arranged at the bottom side of the light guide plate such that the light guide plate is disposed between the electrodes.

2. A device according to claim 1, wherein the LEDs are arranged in the plane of the light guide plate.

3. A device according to claim 2, wherein the light guide plate defines a plurality of holes, and wherein the LEDs are at least partially accommodated in the holes arranged in the light guide plate.

4. A device according to claim 1, wherein the out-coupling structures are arranged in the plane of the light guide plate.

5. A device according to claim 1, wherein at least one of the first and second electrodes is unstructured.

6. A device according to claim 1, wherein at least one of the first and second electrodes is structured.

7. A device according to claim 6, wherein the structured electrode comprises one or more optically transparent areas at the positions where light is to be extracted from the light guide plate by means of the out-coupling structures.

8. A device according to claim 1, wherein at least some of the plurality of LEDs are connected in parallel.

9. A device according to claim 1, wherein the light guide plate is electrically non-conductive providing an electrical isolator between the first and second electrodes.

* * * * *